United States Patent [19]

Yamamoto et al.

[11] Patent Number: 5,206,525
[45] Date of Patent: Apr. 27, 1993

[54] ELECTRIC ELEMENT CAPABLE OF CONTROLLING THE ELECTRIC CONDUCTIVITY OF π-CONJUGATED MACROMOLECULAR MATERIALS

[75] Inventors: Hiromichi Yamamoto; Hideo Kumehara, both of Kawasaki; Takashi Nishibe, Tokyo, all of Japan

[73] Assignee: Nippon Petrochemicals Co., Ltd., Tokyo, Japan

[21] Appl. No.: 743,324

[22] PCT Filed: Aug. 27, 1990

[86] PCT No.: PCT/JP90/01728
§ 371 Date: Aug. 20, 1991
§ 102(e) Date: Aug. 20, 1991

[87] PCT Pub. No.: WO91/10264
PCT Pub. Date: Jul. 11, 1991

[30] Foreign Application Priority Data

Dec. 27, 1989 [JP] Japan .................. 1-336417
Dec. 27, 1989 [JP] Japan .................. 1-336418

[51] Int. Cl.$^5$ ............................ H01L 29/28
[52] U.S. Cl. ........................ 257/40; 257/347
[58] Field of Search .......... 357/4, 8, 23.2, 23.7, 357/23.14, 25; 257/40

[56] References Cited

U.S. PATENT DOCUMENTS

| 4,873,556 | 10/1989 | Hyodo et al. | 357/8 |
| 5,107,308 | 4/1992 | Koezuka et al. | 357/8 |

FOREIGN PATENT DOCUMENTS

| 59-224165 | 12/1984 | Japan | 357/23.7 |
| 62-31174 | 2/1987 | Japan | 357/8 |
| 62-85467 | 4/1987 | Japan | 357/8 |
| 63-76378 | 4/1988 | Japan | 357/23.7 |
| 1-25563 | 1/1989 | Japan | 357/8 |
| 1-259564 | 10/1989 | Japan | 357/8 |

Primary Examiner—Rolf Hille
Assistant Examiner—Minhloan Tran
Attorney, Agent, or Firm—Buchnam and Archer

[57] ABSTRACT

An electric element of the present invention comprises a π-conjugated macromolecular material which is liable to increase its conductivity by its excitation due to dielectric polarization, and a ferroelectric material disposed in the close proximity of said π-conjugated macromolecular material so that polarization of said ferroelectric material in the presence of an electric field causes excitation of said π-conjugated macromolecular material, thereby changing the conductivity of said π-conjugated macromolecular material correspondingly with the strength of said electric field and resultantly controlling said conductivity. The electric element can be used as a d.c. or a.c. relay element, memory element, switching element, or any other active element.

10 Claims, 1 Drawing Sheet

ELECTRIC ELEMENT CAPABLE OF CONTROLLING THE ELECTRIC CONDUCTIVITY OF π-CONJUGATED MACROMOLECULAR MATERIALS

TECHNICAL FIELD

The present invention relates to an electric element and a method of controlling the electric conductivity of a π-conjugated macromolecular material by means of excitation of the π-conjugated macromolecular material, which excitation is caused by polarization of a ferroelectric material under the influence of an electric field.

BACKGROUND ART

A Field-Effect Transistor (abbreviated as FET) using an electric-conductive high polymer to simulate an Si transistor is known as an electric conductivity-controlled element which is responsive to electric signals for controlling the electric conductivity of an organic substance, and is discussed for instance by F. Ebisawa et al. in J. Appl. Phys., 54 (1983) 3255; A. Tsumura et al. in Chem. Lett., (1986) 863; A. Tsumura et al. in Appl. Phys. Lett., 49 (1986) 1210; H. Koezuka et al. in Synth. Met., 18 (1987) 699; A. Tsumura et al. in Synth. Met., 25 (1988) 11 etc.

Polymer transistors which are discussed in these publications are of the same structure as Metal-Oxide-Semiconductor (abbreviated as MOS) or Metal-Insulator-Semiconductor (abbreviated as MIS). These polymer transistors work like a MOSFET made of Si, and their operating principle is supposed to be as follows:

FIG. 2 illustrates the construction of a conventional polymer transistor. Now assume in this Figure that a conductive polymer semiconductor 11 is of P-type. When an electric potential which is negative with respect to a metal electrode (source) 12 is applied to a metal electrode (gate) 13, positive polarization charges appear on the interface between the semiconductor 11 and an insulator layer 15 to cause accumulation of positive holes on the semiconductor surface. Conversely a given positive potential is applied to the gate metal electrode 13, causing appearance of negative polarization charges on the interface between the semiconductor 11 and insulator layer 15 whereby said negative charges and the positive holes in the P-type semiconductor cancel each other, thus forming a depletion region. Electrons will be increasingly accumulated on the semiconductor surface as the positive potential increases, and an "n-invention layer" will finally be formed. If a potential gradient should appear along the semiconductor surface, positive holes or electrons (carriers) in the accumulated layer will be transferred therealong. The width of the passage (channel) through which these carriers travel will vary with a potential applied to the semiconductor surface. Thus, the width of the channel, that is, the conductivity of carriers between a metal electrode (drain) 14 and the metal electrode (source) 12 can be controlled by controlling the potential difference or voltage between the metal electrode (source) 12 and the metal electrode (gate) 13.

An example of another conventional polymer transistor is an FET using ionization conduction in a solid electrolyte which consists of a high polymeric organic substance. This type of polymer transistor is discussed by Shuchi Chao et al, J. Am. Chem. Soc. 109,6627-6631, 1987.

At any rate, a conventional FET type device cannot control potentials to be applied to its gate, drain and source electrodes independently or separately, and therefore, it cannot be used for instance as a relay element.

DISCLOSURE OF THE INVENTION

An object of the present invention is to provide a method of controlling the electric conductivity of a π-conjugated macromolecular material by putting individual molecules of the π-conjugated macromolecular material in the excited states (by exciting individual molecules of π-conjugated macromolecular materials) through the polarization of a ferroelectric material; and another object of the present invention is to provide an electric element which is capable of controlling its electric conductivity according to a totally new operating principle.

To attain these objects of the present invention a polarizable ferroelectric material is disposed close to the π-conjugated macromolecular material, preferably an oriented π-conjugated macromolecular material.

More specifically, the electric element of the present invention is characterized by comprising a π-conjugated macromolecular material with which at least two electrodes are in ohmic contact and can decrease in electric conductivity by being put in the excited states by being excited due to the polarization of a dielectric substance, a ferroelectric material disposed close to the π-conjugated macromolecular material and electrodes for applying an electric field of a given strength to said ferroelectric material.

Further, the electric conductivity controlling the method of the present invention comprises applying an electric field of a given strength to said ferroelectric material to cause polarization therein whereby said π-conjugated macromolecular material is put in the excited states (excited) and then permitting said π-conjugated macromolecular material to vary in electric conductivity correspondingly with the strength of said electric field so applied.

Further description of the invention is given below:

The π-conjugated macromolecular material referred to herein comprises a polymer in which bonds formed by overlap of the π-electron orbits of adjacent atoms in the polymer main chain are evenly distributed along the polymer main chain. The π-conjugated macromolecular material actually used is electrically neutral, containing substantially neither electron-donating dopants such as Na and K nor electron-accepting dopants such as iodine and $PF_6$. A very small amount of the above dopants may be contained so far as their presence causes substantially no alteration of the π-conjugated macromolecular material in nature. If the π-conjugated macromolecular material contains the dopants as is the case with such material produced by electrolytic polymerization, these dopants may be eliminated from said macromolecular material according to the ordinary process since the macromolecular material used herein is electrically neutral.

The π-conjugated macromolecular materials appropriate for use in the electric conductivity-controlled element of the present invention include poly-p-phenylenevinylene; poly 2, 5-thienylene vinylene; poly 2, 5-dimethoxy-p-phenylenevinylene; polyacetylene; polypyrrole; polyaniline; polythiophene; poly-paraphenylene; their derivatives; and the like. As a matter of course, two or more of these materials may be mixed for use.

For the purpose of the present invention, π-conjugated macromolecular materials which have been oriented, may preferably be used. The orientation can be performed according to well known processes such as stretching. Significant effects may be caused by stretching at least 0.5 times, preferably at least 1 time.

The ferroelectric material used herein is dielectric substance. The polarization states or degrees of some of the dielectric materials depend on their histories. And those dielectric materials exhibit unique properties such as spontaneous polarization even in the absence of any electric fields applied. This group of dielectric materials have characteristics very similar to those of ferromagnetics in many respects (although, of course, distinguishable from ferromagnetics), and are called "ferroelectric materials".

Ferroelectric materials may, in terms of chemical compositions and structures, be classified into the following four Groups: a) Groups of tartaric acid salts or tartrates; b) Group of phosphoric acid salts; c) Group of oxygen octahedrons; and d) Group of the others.

Typical of ferroelectric materials belonging to Group (a) are Roschel salt or potassium sodium tartrate ($NaK(C_4H_4O_6) \cdot 4H_2O$). Other ferroelectric materials of Group (a) are, for example, $LiK(C_4H_4O_6) \cdot 4H_2O$; $NaNH_4(C_4H_4O_6) \cdot 4H_2O$; $NaRb(C_4H_4O_6) \cdot 4H_2O$; and $NaTl(C_4H_4O_6) \cdot 4H_2O$.

Ferroelectric materials belonging to Group (b) are typically represented by potassium phosphate ($KH_2PO_4$). Other examples are $NH_4H_2PO_4$; $KH_2AsO_4$; and $RbH_2PO_4$.

Ferroelectric materials belonging to Group (c) are typically represented by barium titanate ($BaTiO_3$). Other examples are cadmium pyroniobate ($Cd_2Nb_2O_7$); lead metaniobate ($PbNb_2O_6$) and tungsten trioxide ($WO_3$). In each of these materials an octahedron is formed by encircling a single, small, easily polarizable ion ($Ti^{4+}$ in case of barium titanate) with six oxygen ions $O^{2-}$.

The other ferroelectric materials belonging to Group (d) are, for instances, guanidine aluminium sulfate hexahydrate ($NHC(NH_2)_2AlH(SO_4)_2 \cdot 6H_2O$); glycine sulfate (($CH_2NH_2COOH)_3 H_2SO_4$); and thiourea $SC(NH_2)_2$.

Ferroelectric materials usable herein further include inorganic materials such as potassium dihydrogen phosphate, barium titanate, lead titanate, lead niobate, lithium tantalate and potassium sodium tartrate, or organic materials such as polyacrylonitrile, polyvinyl alcohol, polyethylene oxide, cellulose, polyvinyl fluoride their derivatives and the like. Two or more of these ferroelectric materials may be mixed for use.

In the present invention it is important to dispose the ferroelectric material so close to the π-conjugated macromolecular material that the polarization induced in the ferroelectric material may change the electronic condition of the π-conjugated macromolecular material.

The term "electric polarization" used herein means electric polarization of a dielectric substance (insulator), which may be called "dielectric polarization". Although electric polarization of such a material depends for its classification on the electrical structure of the material, it can be classified into "electronic polarization", "ionic polarization", and "orientation polarization" in terms of mechanism. Electronic polarization is referred to as electric polarization caused by a change in distribution of electrons in atoms or molecules under an electric field. Ionic polarization is referred to as electric polarization caused by ions among dielectric polarizations of ion crystals. This ionic polarization is caused by displacements of positive and negative ions from their equilibrations in opposite directions in an ionic crystal when an electric field is applied to the ionic crystal. Also, modification of electron cloud within the core of an ion contributes to the polarization. Finally, orientation polarization is referred to as electric polarization caused by the distribution of orientations of permanent dipoles in a substance composed of molecules having the dipoles being biassed in the direction in parallel to an electric field when applied to the substance. The present invention covers all of these different polarizations.

In the present invention, there may be used any methods for disposing the ferroelectric material and the π-conjugated macromolecular material close to each other.

Concretely, there may be used a thin film which comprises a mixture of the ferroelectric material and π-conjugated macromolecular material. The thin film may be prepared, for example, by dissolving the ferroelectric material in a suitable solvent to obtain a solution thereof, impregnating the π-conjugated macromolecular film with the ferroelectric solution and then, if necessary, volatilizing the solvent from the impregnated film. As an alternative, the ferroelectric and π-conjugated macromolecular materials may be dissolved in a common solvent, and then the solution thus prepared may be formed into a thin film. Otherwise, fine-pulverized ferroelectric and π-conjugated macromolecular materials may be mixed together, and the mixture may be formed to a thin film. Such a thin film may also be formed by ion-plantation of the ferroelectric material in a π-conjugated macromolecular film or by sputtering the ferroelectric material to a π-conjugated macromolecular film. No matter which method may be used, it is essential that these different materials be disposed close to each other.

Another method to achieve disposition of the ferroelectric material close to the π-conjugated macromolecular material consists of lamination of a thin film or layer of the ferroelectric material with a thin film of the π-conjugated macromolecular material.

The aforesaid film forming methods can be classified into wet and dry ones. The wet method uses an appropriate medium for forming the film, whereas the dry method uses a vacuum vessel for forming the film. The degree of vacuum will depends on the particular dry process actually employed. Generally the dry method has an advantage of not being affected by adverse effects on film products by air such as would be caused in the wet method, and accordingly the former may be called "clean process". Equipment required for the dry method, however, is very expensive, and the dry method is disadvantageous in that it can treat only a small number of materials for the film as compared with the wet method.

Examples of the wet method are the Langmuier Brogette method (LB method), the solvent casting method and the electrochemical method. The langmuier Brojett method comprises allowing an aliphatic compound having a carboxyl group such as stearic acid to float on water and then dipping the floating material onto a substrate.

The solvent casting method comprises dissolving a selected material in a solvent, dropping the thus prepared solution on a substrate and then evaporating the solvent from the solution-dropped substrate to obtain a film coating on the substrate. In addition to the evaporation on the substrate, the solvent may be slowly evaporated on mercury (Hg) or may forcibly be evaporated by spin cast.

The electrochemical method comprises dissolving selected materials in an electrolyte and then subjecting the thus dissolved material to oxidation or reduction reaction to prepare a film material and effect film formation.

Examples of the dry method are chemical vapor deposition method (CVD method), vacuum vapor evaporation method, epitaxial growth method and sputtering method.

The CVD method comprises introducing a selected gas into a vacuum vessel and then energetically activating the thus introduced gas by exposure to light, heat or plasma, thereby preparing a film material and effecting film formation.

The vacuum evaporation method comprises evaporating a selected material by electrical heating in a vacuum vessel ($10^{-5}$ to $10^{-7}$ Torr), thereby vacuum depositing or laminating the thus evaporated material on a substrate.

Likewise, the epitaxial growth method comprises evaporating a selected material and controlling every lamination of the vapor deposited material layers (thickness of each layer being several angstrom) on a substrate in an ultra-high vacuum vessel ($10^{-9}$ to $10^{-11}$ Torr).

These vacuum evaporation and epitaxial growth methods require electric heating of selected materials to be evaporated. Some materials which may be easily damaged by heating cannot be used in these methods and, however, such thermally destructible materials can be laminated by the use of a so-called sputtering method. More specifically, a rare gas (such as argon) excited or ionized by electron beam or electric discharge is radiated onto the surface of a selected solid material to sputter the surface material and the sputtered surface material is then laminated on a substrate.

Necessary films may be formed by any of the methods described above.

An example of the electric element of the present invention is described below with reference to the accompanying drawings.

FIG. 1 shows schematically an electric element according to the present invention. The element shown comprises a substrate 7 made of a dielectric substance such as polyethylene. The substrate is provided on one side 7a with input and output metal electrodes 1 and 2 (such as gold coatings) spaced at a predetermined distance and further with a 90 -conjugated macromolecular coating 4 so that it encloses and makes ohmic-contact with the input and output metal electrodes 1 and 2. The $\pi$-conjugated macromolecular coating 4 has ferroelectric substance mixed therewith, but the $\pi$-conjugated macromolecules make up a continuous phase at least between the input and output electrodes 1 and 2, thus permitting electrons to travel between these electrodes.

The substrate is provided on the other side 7b with a first control electrode 3 such as gold coating on the other surface 7b.

A dielectric film 5 such as polyethylene film is provided on said $\pi$-conjugated macromolecular coating 4 mixed with the ferroelectric material. A second control electrode 6 such as gold coating is provided on the dielectric film 5. The plane in which the metal electrodes 1 and 2 are laid is sandwiched in between the first and second control metal electrodes 3 and 6.

The electric element constructed as mentioned above functions as follows:

When an electric field whose strength is not so high as to cause dielectric breakdown between the first and second electrodes 3 and 6, is applied between these electrodes, the ferroelectric substance of the ferroelectric-and-$\pi$-conjugated macromolecular mixture film 4 will be polarized, thus causing the $\pi$-conjugated macromolecules in the close proximity of the polarized ferroelectric substance to be excited. It is generally known that the conductivity of the $\pi$-conjugated macromolecular material ranges from $10^{-7}$ to $10^{-8}$ S·cm$^{-1}$ or below when the material is electrically neutral and that the conductivity of the $\pi$-conjugated macromolecular material in its excited state will increase to at least $10^5$ times that of an electrically neutral one. In the present invention, the $\pi$-conjugated macromolecules are, of course, not particularly limited in degree of variation in their conductivity, and the degree of variation may be such that the macromolecules are usable as a material for the electric element. It, however, suffices that the conductivity of the $\pi$-conjugated macromolecular material in the electric conductivity-controlled element increase to 10 to $10^2$ times that of the neutral one when in its excited state.

The degree of excitation of the $\pi$-conjugated macromolecular material can be determined, for instance, in terms of the conductivity of the material. It is realized that the conductivity of the ferroelectric-and-$\pi$-conjugated macromolecular mixture film 4 between the input and output electrodes 1 and 2 changes greatly depending on whether an electric field is applied between the control electrodes 3 and 6. This permits the conductivity of an electric conductivity-controlled element to be controlled according to the new principle.

The electric element of the present invention is applied between the control electrodes 3 and 6 and is different in manner of control from a conventional FET (field effect transistor) in which a voltage is applied between the reference or source electrode 12 (corresponding to either the electrode 1 or 2) and the control or gate electrode 13 (corresponding to the control electrode 3 or 6) as shown in FIG. 2.

The electric conductivity-controlled element of the present invention is capable of functioning as a memory in which its maximum and minimum conductivities represent binaries "1" and "0" respectively. The resistivity of the mixture film of the electric conductivity-controlling element can be changed in response to the variation in strength of an electric field applied, and therefore, it can form an inverter and a logic circuit. Also, it can be used as a switching element.

The electrodes 3, 6 and electrodes 1, 2 are electrically functional independently of, and separately from, each other, and therefore, the electric conductivity-controlled element can be used as a relay not only for d.c. signals but also for a.c. signals.

In short, application of a.c. or d.c. electric field across the electric conductivity-controlled element of the present invention causes electric polarization of the ferroelectric substance in its ferroelectric-and-$\pi$-conjugated macromolecular mixture film, thereby permitting the element to function as a switching, memory or a.c. or d.c. relay element. Advantageously such an active element can be reduced to a very small size.

Thanks to the use of the new operating principle which is totally different from the conventional field effect transistor, the electric conductivity-controlled element of the present invention is structurally simpler than the field effect transistor, and it can function as an a.c. relay in addition to switching and memory elements the performances of which the conventional field effect transistor can assume.

In the electric conductivity-controlled element or the present invention, its electric conductivity can be controlled in terms of a single molecular chain in the $\pi$-conjugated macromolecular material, and therefore theoretically it can be made up by a single molecular chain. This permits a drastic increase of the degree in which such active elements can be integrated in a given minute space as compared with a conventional active element.

BRIEF DESCRIPTION OF DRAWINGS

In FIG. 1, input and output electrodes are indicated by 1 and 2; control electrodes are indicated by 3 and 6; a mixture coating is indicated by 4; an insulator layer is indicated by 5; and an insulator substrate is indicated by 7.

BEST MODE OF CARRYING OUT THE INVENTION

Figure 1:
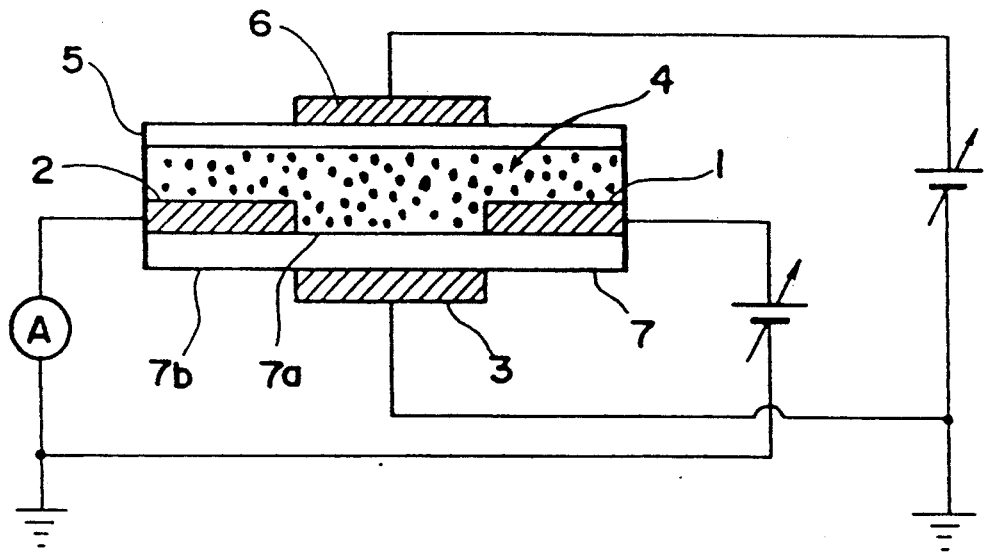
FIG. 1 shows schematically the structure of an electric element according to one embodiment of the present invention.
Figure 2:
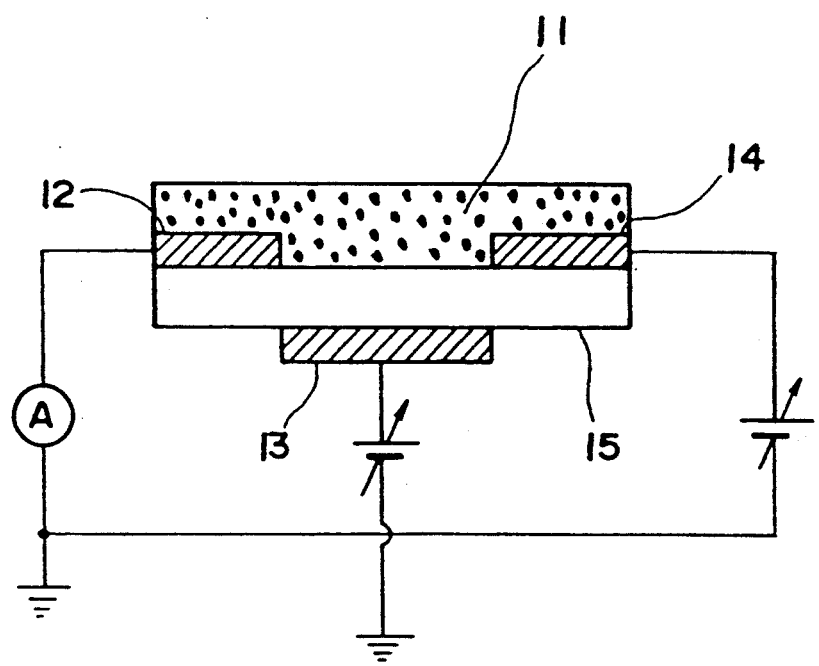
FIG. 2 shows schematically the structure of a conventional FET using a conductive macromolecular material.

The present invention will be described below in terms of examples which should be understood only as being illustrative. The present invention should not be restricted by any of such examples.

EXAMPLE 1

A water solution of a polymer molecule precursor of poly-p-phenylenevinylene (PPV) was prepared as was taught in U.S. Pat. No. 3,401,152 issued to R.A. Wessling and R.G. Zimmerman in 1968. Potassium dihydrogen phosphate (KDP) was added to the water solution thus prepared in the ratio of 91.58 percent by weight with respect to PPV. The mixture in solution was dropped onto an $SiO_2$ layer (dielectric layer 7 in FIG. 1), which had electrodes 1 and 2 coated thereon, and then a one-micron thick film was formed on the $SiO_2$ layer by spincasting. The film so formed was heated at 200° C. for 8 hours in vacuum, and the precursor was changed to PPV.

A ten-micron thick polyethylene coating (dielectric film 5 in FIG. 1) was formed on the mixture film by vacuum deposition, and then electrodes 3 and 6 were formed by depositing gold in vacuum.

The conductivity of an electric conductivity-controlled element thus made was $10^{-10}$ S·cm$^{-1}$ in vacuum under an electric field of below $10^3$ V/cm between the electrodes 3 and 6, whereas the conductivity of the electric conductivity-controlled element was $10^{-8}$ S·cm$^{-1}$ in vacuum under an electric field of over $10^3$ V/cm therebetween. Thus, the conductivity of the electric conductivity-controlled element was observed to increase $10^2$ times.

It was shown that application of an electric field of controlled strength permits controlling of the conductivity of the $\pi$-conjugated macromolecular substance.

EXAMPLE 2

A water-and-ethanol (1:1) solution of a polymer precursor of polythienylene vinylene (PTV) was prepared as was taught by I. Murase et al., Polymer Commun., 28, 229 (1967). Potassium dihydrogen phosphate (KDP) was added to the water and ethanol solution thus prepared in the ratio of 91.58 percent by weight with respect to PTV. The mixture in solution was dropped onto $SiO_2$ (dielectric layer 7 in FIG. 1), which had electrodes 1 and 2 coated thereon, and then a one-micron thick film was formed on the $SiO_2$ by spincasting. The thus formed film was heated at 200° C. for 8 hours in vacuum to change the precursor to PTV.

A ten-micron thick polyethylene coating (dielectric film 5 in FIG. 1) was formed on the mixture film by vacuum deposition, and then electrodes 3 and 6 were formed by depositing gold in vacuum.

The conductivity of an electric conductivity-controlled element thus made was $10^{-10}$ S·cm$^{-1}$ in vacuum when an electric field of below $10^3$ V/cm was applied between the electrodes 3 and 6, whereas the conductivity of the electric conductivity-controlled element was $10^{-8}$ S·cm$^{-1}$ in vacuum when an electric field of over $10^3$ V/cm was applied between the electrodes 3 and 6. Thus, the conductivity of the electric conductivity-controlled element was observed to increase $10^2$ times.

It was shown that application of electric field of controlled strength permits controlling of the conductivity of $\pi$-conjugated macromolecular substance.

EXAMPLE 3

Gold was vacuum-deposited onto a thirty-micron thick polyethylene substrate 7 to form electrodes 1 and 2 as shown in FIG. 1. These electrodes were used to form a polypyrrole film on the polyethylene substrate 7 by elctropolymerization in an acetonitrile solvent containing polypyrrole and tetramethyl ammonium paratoluene sulfonate. According to an ordinary process, the polypyrrole film thus formed was dedoped to be made electrically neutral. The dedoped polypyrrole film was impregnated with a dilute hydrochloric acid solution in which sodium tartrate was dissolved. The amount of sodium tartrate impregnated in the polypyrrole film was 10 percent by weight. The polypyrrole film impregnated with the dilute hydrochloric acid solution was stretched about 3 times under an electric field of 50 KV/cm and was then freed from the dilute hydrochloric acid by evacuation to obtain a stretched polypyrrole film.

A one-micron thick polyethylene was applied, as an dielectric coating 5, to the thus obtained polypyrrole film 4 by vacuum deposition. Finally, gold was applied to complete electrodes 3 and 6 by vacuum deposition as shown in FIG. 1.

The conductivity of an electric conductivity-controlled element thus obtained was $10^{-9}$ S·cm$^{-1}$ in vacuum when no electric field was applied to between the electrodes 3 and 6, whereas the conductivity of this electric conductivity-controlled element was $10^{-4}$ S·cm$^{-1}$ when 50 volts were applied to between electrodes 3 and 6. Thus, the conductivity of the electric conductivity-controlled element was observed to increase $10^5$ times.

It was shown that application of an electric field of controlled strength permits controlling of the conductivity of the $\pi$-conjugated macromolecular substance.

POSSIBLE INDUSTRIAL APPLICATIONS OF THE INVENTION

The method of the present invention uses a totally new operating principle, and an electric element using such operating principle can be used as a memory element, a switching element, a.c. and d.c. relay elements and the like.

We claim:

1. An electric element which comprises:
   a $\pi$-conjugated macromolecular material which is liable to increase its conductivity when it is put in an excited state by polarization of a dielectric substance;
   a ferroelectric material disposed so close to said $\pi$-conjugated macromolecular material that excitation of said $\pi$-conjugated macromolecular material occurs in response to polarization of said ferroelectric material;
   a pair of input and output electrodes disposed at the opposite ends of said $\pi$-conjugated macromolecular material to make their respective ohmic-contacts therewith; and
   a pair of control electrodes disposed so as to sandwich said $\pi$-conjugated macromolecular material in the direction perpendicular to the direction in which said input and output electrodes are laid, the conductivity of said electric element between input and output electrodes varying corresponding to the voltage of the electric field when an electric field is applied between said control electrodes.

2. An electric element according to claim 1, wherein the $\pi$-conjugated macromolecular material is formed into a layer and is then laminated onto the ferroelectric material layer.

3. The electric element according to claim 2 which further comprises a dielectric film to separate each of said control electrodes from said $\pi$-conjugated macromolecular material.

4. The electric element according to claim 1, wherein said $\pi$-conjugated macromolecular material has been oriented by stretching.

5. The electric element according to claim 4 which further comprises a dielectric film to separate each of said control electrodes from said $\pi$-conjugated macromolecular material.

6. The electric element according to claim 1, wherein said ferroelectric material is mixed with said $\pi$-conjugated macromolecular material and the mixture is formed into a layer whereby said $\pi$-conjugated macromolecular material is disposed close to said ferroelectric material.

7. The electric element according to claim 6 which further comprises a dielectric film to separate each of said control electrodes from said $\pi$-conjugated macromolecular material.

8. The electric element according to claim 1 which comprises a dielectric film to separate each of said control electrodes from said $\pi$-conjugated macromolecular material.

9. A method of controlling the conductivity of a $\pi$-conjugated macromolecular material, which material is capable of increasing its conductivity when put in its excited state by polarization of a dielectric substance, which comprises:
   disposing a ferroelectric material so close to said $\pi$-conjugated macromolecular material that polarization of said ferroelectric material causes excitation of said $\pi$-conjugated macromolecular material; and
   applying an electric field of controlled strength to said ferroelectric material to cause polarization of said ferroelectric material, whereby said $\pi$-conjugated macromolecular material is put in its excited state and the conductivity of said $\pi$-conjugated macromolecular material changes corresponding to the strength of said electric field.

10. The method of controlling the conductivity of a $\pi$-conjugated macromolecular material according to claim 9 wherein said $\pi$-conjugated macromolecular material has been oriented by stretching.

* * * * *